(12) United States Patent
Chen et al.

(10) Patent No.: US 8,472,646 B2
(45) Date of Patent: Jun. 25, 2013

(54) STRUCTURE AND MANUFACTURING METHOD OF INVERSED MICROPHONE MODULE AND MICROPHONE CHIP COMPONENT

(75) Inventors: Jung-Tai Chen, Kaohsiung County (TW); Chun-Hsun Chu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 1857 days.

(21) Appl. No.: 11/690,842

(22) Filed: Mar. 25, 2007

(65) Prior Publication Data
US 2008/0075309 A1    Mar. 27, 2008

(30) Foreign Application Priority Data
Sep. 8, 2006    (TW) ................................. 95133255 A

(51) Int. Cl.
*H04R 25/00*    (2006.01)
(52) U.S. Cl.
USPC .......................................... 381/175; 381/369
(58) Field of Classification Search
USPC .................. 381/355, 357, 361, 369, 173–176
See application file for complete search history.

(56) References Cited

U.S. PATENT DOCUMENTS

| | | | |
|---|---|---|---|
| 6,088,463 A * | 7/2000 | Rombach et al. | 381/174 |
| 6,781,231 B2 | 8/2004 | Minervini | |
| 7,204,009 B2 * | 4/2007 | Kawamura et al. | 181/171 |
| 7,269,267 B2 * | 9/2007 | Song et al. | 381/175 |
| 7,292,696 B2 * | 11/2007 | Saeki et al. | 381/175 |
| 7,903,831 B2 * | 3/2011 | Song | 381/174 |
| 2004/0046245 A1 | 3/2004 | Minervini | |
| 2007/0071260 A1 * | 3/2007 | Mullenborn et al. | 381/175 |
| 2008/0075308 A1 * | 3/2008 | Wei et al. | 381/175 |

FOREIGN PATENT DOCUMENTS

| | | |
|---|---|---|
| CN | 1787367 | 6/2006 |
| CN | 1822722 | 8/2006 |
| TW | 566052 | 12/2003 |
| TW | I235010 | 6/2005 |

OTHER PUBLICATIONS

"First Office Action of China Counterpart Application", issued on Mar. 22, 2011, p. 1-p. 10.
"Office Action of Taiwan counterpart application", issued on Jun. 12, 2009, p. 1-p. 3.
"Second Office Action of China Counterpart Application", issued on Sep. 22, 2011, p. 1-p. 7.

* cited by examiner

*Primary Examiner* — Suhan Ni
(74) *Attorney, Agent, or Firm* — Jianq Chyun IP Office

(57) ABSTRACT

An inversed microphone module is provided. The module includes a substrate, a microphone chip, a back acoustic cavity cover, and a sealing material. The substrate has a plurality of connection pads and an acoustic hole. The microphone chip has a first surface and an opposite second surface. A plurality of electrically bonding portions and an acoustic sensing are disposed on the first surface. The microphone chip is electrically coupled to the connection pads of the substrate through the electrically bonding portions, and the acoustic hole corresponds to the acoustic sensing portion. The back acoustic cavity cover is fixed to the second surface and defines a back acoustic cavity with the acoustic sensing portion and the microphone chip. The sealing material encapsulates the microphone chip and covers the substrate, so that the sealing material, the substrate, the acoustic sensing portion, and the first surface define a front acoustic cavity.

12 Claims, 10 Drawing Sheets

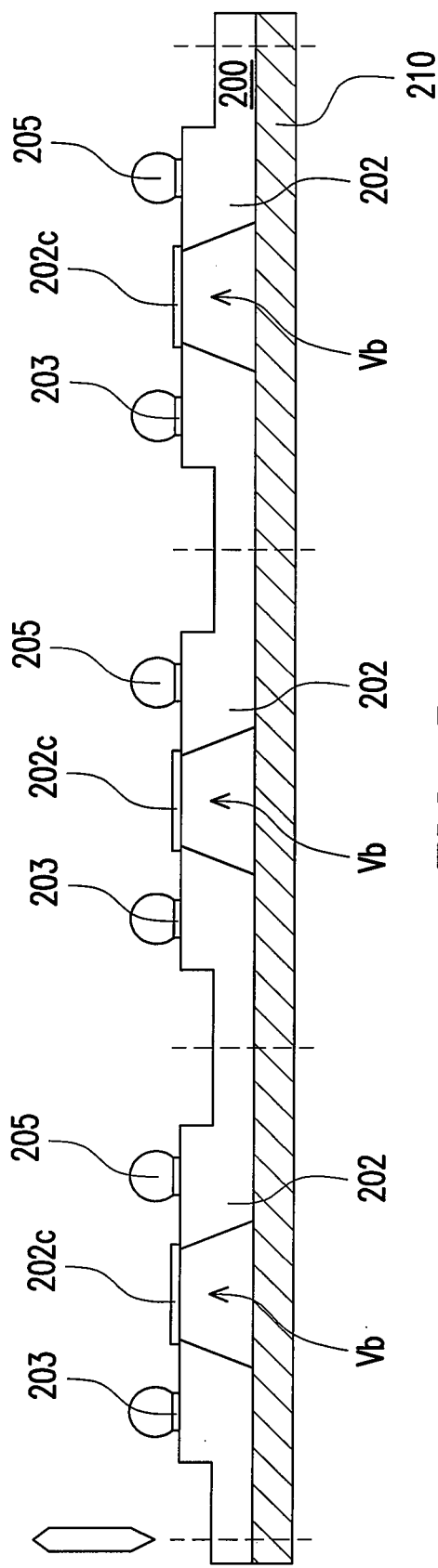
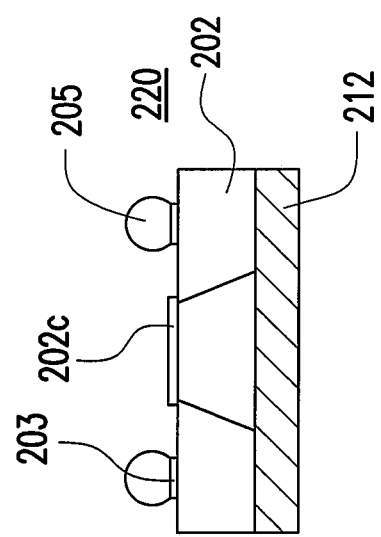
FIG. 5
FIG. 6

STRUCTURE AND MANUFACTURING METHOD OF INVERSED MICROPHONE MODULE AND MICROPHONE CHIP COMPONENT

CROSS-REFERENCE TO RELATED APPLICATION

This application claims the priority benefit of Taiwan application serial no. 95133255, filed Sep. 8, 2006. All disclosure of the Taiwan application is incorporated herein by reference.

BACKGROUND OF THE INVENTION

1. Field of the Invention

The present invention relates to a structure and a manufacturing method of an inversed microphone module and a microphone chip component.

2. Description of Related Art

Along with the personalization and popularization of global communication, it has become very common that everybody has at least one mobile phone. Due to the requirement of parenthood, even school children have mobile phones, thus, the age of mobile phone's consumer group is greatly reduced to be below 10.

Moreover, according to a report issued by Topology Research Institute (TRI) in September, 2005, global production of mobile phones in 2005 is about 760 millions, and the number of mobile phone users is up to 1.685 billions. According to TRI's estimation, global mobile phone users will be up to 2.236 billions in 2009. Obviously, the size of mobile phone market is very large.

Nowadays, for the convenience of usage, a microphone for camera function is further disposed in a mobile phone besides the microphone for conversing. Accordingly, the requirement to microphone is increased along with the increase in requirement to video/audio function.

A microphone module manufactured with micro electromechanical system (MEMS) has small thickness and volume, and surface mount process can be performed thereto through solder reflow. Thus, to meet the requirements of small volume and low coat of mobile phones, microphone module of smaller volume is gradually taking up the market of electric condenser microphone (ECM).

In addition, the microphone module manufactured with MEMS has low power consumption (160 uA), thus, the power consumption thereof is only about ⅓ of ECM. Since a mobile phone has limited electricity storage, such advantage of MEMS microphone module urges the ECM microphone to be replaced by MEMS microphone module.

As to other products equipped with microphones, the requirement to MEMS microphone module is also increasing. For example, MEMS microphone module is being applied to portable audio player and digital camera having micro drive (MD) or flash memory. Accordingly, MEMS microphone module may has remarkable market occupancy in foregoing applications.

An existing ECM microphone module will be described. Refer to FIG. 1, which is a cross-sectional view of a conventional Knowles microphone module.

Generally, the microphone chip 10 has an acoustic sensing portion 12. The microphone chip 10 and the logic chip 20 are electrically coupled to the bottom plate 30. The supporting ring 40 and the top plate 50 are sequentially stacked on the bottom plate 30 by using conductive compound 32. The top plate 50 has an opening 52 which allows acoustic wave to pass through.

The space from the opening 52 to the acoustic sensing portion 12 is referred to as a front acoustic cavity. The space from the acoustic sensing portion 12 to the bottom plate 30 is referred to as a back acoustic cavity.

In the Knowles microphone module, supporting ring 40, top plate 50, bottom plate 30, microphone chip 10, and logic chip 20 form the front acoustic cavity V1 (referring to FIG. 2), and acoustic sensing portion 12 and microphone chip 10 form the back acoustic cavity V2.

In the front acoustic cavity V1, liquid compound 34 is dispensed on the logic chip 20 through a dispensing process for protecting the logic chip 20 and the connection joins thereof to the bottom plate 20. The liquid compound 34 cannot be dispensed onto the microphone chip 10 for once the liquid compound 34 is dispensed onto the microphone chip 10, it may flow to the acoustic sensing portion 12 so that the performance of the microphone module may be affected.

Besides, from the point of acoustics, the relationship between the front acoustic cavity and the restraining frequency is as following according to Helmholtz theorem:

$$f_e = \frac{c}{2\pi}\sqrt{\frac{s}{Vl_e}} \qquad \text{(Expression 1)}$$

In expression 1, V represents the volume of the front acoustic cavity, and $f_e$ represents the restraining frequency. The restraining frequency shows the acoustic sensing range of the microphone module and which is the larger, the better. In other words, the volume of the front acoustic cavity is the smaller, the better. The back acoustic cavity is a space provided for the transfiguration of acoustic sensing portion 12, thus, it is the larger, the better.

In overview, the conventional technique has at least following disadvantages:

(1) the microphone chip is disposed within the acoustic cavity and is not protected by sealing compound, thus, the reliability of the microphone module is low, and if the microphone module falls to ground (for example, a mobile phone is dropped to the ground), the microphone module may be damaged since the solder joints of the microphone chip are not protected by sealing compound.

(2) The dispensing process is time-consuming, thus, it is difficult to increase the production throughput.

(3) The acoustic cavity is defined by stacking supporting ring and top plate, thus, the structure of the entire microphone module is not compact enough and the volume thereof cannot be reduced, and furthermore, the volume of the front acoustic cavity cannot be reduced, which results in small acoustic sensing range of the microphone module.

SUMMARY OF THE INVENTION

Accordingly, the present invention is directed to provide an inversed microphone module. The inversed microphone module includes a substrate, a microphone chip, a back acoustic cavity cover, and a sealing material. The substrate has a plurality of connection pads and an acoustic hole. The microphone chip has a first surface and an opposite second surface. A plurality of electrically bonding portions and an acoustic sensing are disposed on the first surface. The microphone chip is electrically coupled to the connection pads of the substrate through the electrically bonding portions, and the acoustic hole corresponds to the acoustic sensing portion. The back acoustic cavity cover is fixed to the second surface and defines a back acoustic cavity with the acoustic sensing portion and the microphone chip. The sealing material encapsulates the microphone chip and covers the substrate, so that the sealing material, the substrate, the acoustic sensing portion, and the first surface define a front acoustic cavity.

According to the present invention, the substrate has an acoustic hole, and the microphone chip is electrically coupled to the connection pad of the substrate in inversed manner, and the sealing material, substrate, acoustic sensing portion, the first surface of the microphone chip define a front acoustic cavity, thus, the front acoustic cavity defined is smaller than that in a conventional microphone module, accordingly the restraining frequency can be increased and the acoustic sensing range can be widened.

According to the structure of an inversed microphone module described above, the shape of the back acoustic cavity cover includes a protruding shape.

According to the present invention, the back acoustic cavity cover is fixed to the second surface of the microphone chip, the back acoustic cavity cover, the acoustic sensing portion, and the microphone chip define a back acoustic cavity, and the back acoustic cavity cover has a protruding shape, thus, the back acoustic cavity can be further enlarged.

According to the structure of an inversed microphone module described above, the acoustic hole is a first via and which may be a straight via. Preferably, the first via is a stepping via, and the opening thereof close to the microphone chip is larger than the other opening. Accordingly, a suitable shape of the front acoustic cavity can be formed by the substrate, the sealing material, and the acoustic sensing portion.

The inversed microphone module described above further includes a package covering the substrate, the sealing material, the microphone chip, and the back acoustic cavity cover.

According to the present invention, the package covers the substrate and the microphone chip, so that the microphone chip and the connection joints thereof can be well protected, accordingly the affection of external vibration and humidity can be reduced.

According to the present invention, a package is used to replace the conventional top plate and supporting ring, so that the relative process for coating inter-layer conductive compound can be skipped, and the volume of the module be greatly reduced.

Moreover, the package exposes the surface of the back acoustic cavity cover, and the surface of the package is level to the exposed surface of the back acoustic cavity cover, so that the volume of the module can be further reduced.

The inversed microphone module described above further includes a logic chip covered by the package.

According to the structure of an inversed microphone module described above, the microphone chip and the logic chip can be integrated into a system chip for replacing the original microphone chip, so that the structure of the module can be further compressed.

The present invention further provides a microphone chip component including a microphone chip and a back acoustic cavity cover. The microphone chip has a first surface and an opposite second surface, and a plurality of electrically bonding portions and an acoustic sensing portion are disposed on the first surface. The back acoustic cavity cover is fixed to the second surface of the microphone chip, and the back acoustic cavity cover, the acoustic sensing portion, and the microphone chip define a back acoustic cavity.

The present invention further provides a manufacturing method of an inversed microphone module. The method includes: forming a microphone chip component; providing a substrate having a plurality of module regions, wherein each module region has an acoustic hole and a plurality of connection pads; electrically coupling the microphone chip component to the connection pads of the module regions on the substrate; encapsulating the microphone chip component and covering the substrate with a sealing material, so that the sealing material, the substrate, and the microphone chip component defining a front acoustic cavity; and performing a singulation step, cutting the substrate according to the module regions to obtain a plurality of microphone modules.

The present invention further provides a manufacturing method of an inversed microphone module. The method includes following steps. First, a wafer is provided, and a plurality of microphone chips have been formed on the wafer, wherein each microphone chip has a first surface and an opposite second surface, and a plurality of electrically bonding portions and a acoustic sensing portion are disposed on the first surface. A back acoustic plate is provided and bonded to the back of the wafer, so that the back acoustic plate, the acoustic sensing portion, and the microphone chip define a back acoustic cavity. The wafer and the back acoustic plate are cut to separate the microphone chip and the back acoustic plate and obtain a plurality of microphone chip components. Each of the microphone chip components includes a microphone chip and a back acoustic cavity cover, wherein the back acoustic cavity cover is obtained by cutting the back acoustic plate. A substrate having a plurality of module regions is provided, and each of the module regions has an acoustic hole and a plurality of connection pads. The microphone chip component is electrically coupled to the connection pads of the module regions on the substrate through the electrically bonding portions, and the acoustic hole of each module region corresponds to the acoustic sensing portion of each microphone chip. A sealing material is adopted for encapsulating the microphone chip and covering the substrate, so that the sealing material, the substrate, the acoustic sensing portion, and the first surface define a front acoustic cavity. A singulation step is performed and the substrate is cut according to the module regions to obtain a plurality of microphone modules.

According to the manufacturing method of an inversed microphone module described above, the back acoustic plate may be a flat plate or a plate having predetermined roughness.

According to the present invention, a wafer having a plurality of microphone chips is bonded to a corresponding back acoustic plate, and after that, the wafer and the back acoustic plate are cut, so that various components can be processed together.

The manufacturing method of an inversed microphone module described above further includes forming a package with a packaging material for covering the substrate and the microphone chip component before performing the singulation step.

According to the present invention, a package is formed with a packaging material for covering the substrate and the microphone chip components, so that a batch of microphone chips and the connection joints thereof can be packed and protected all together by performing one mature molding process, such as resin transform molding to reduce the time consumed. Moreover, the molding process is mature and has high qualified rate, thus, the production throughput can be increased and the manufacturing cost can be reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3~11 illustrate the manufacturing flow of an inversed microphone module according to the first embodiment of the present invention.

DESCRIPTION OF EMBODIMENTS

First Embodiment

The manufacturing flow of an inversed microphone module according to the first embodiment of the present invention will be described below with reference to FIGS. 3~11.

Figure 3:
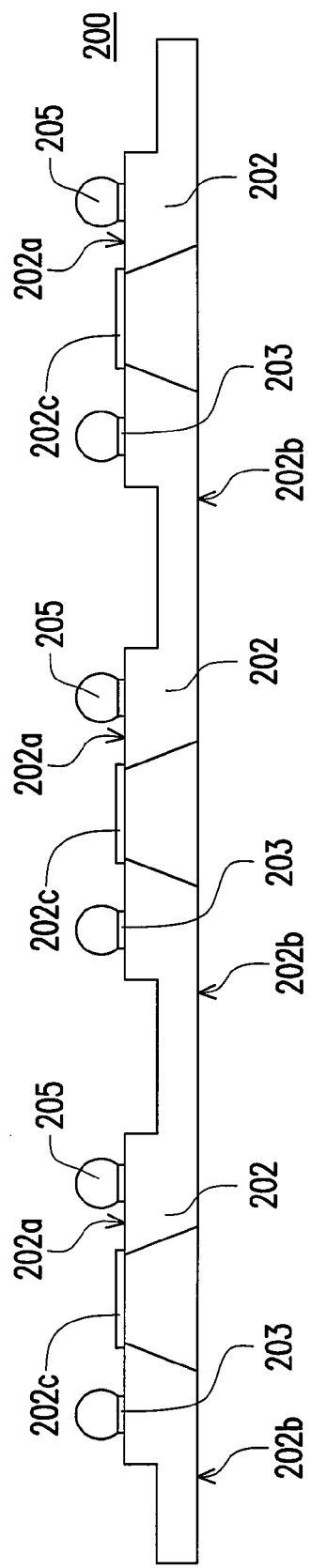
Figure 16:
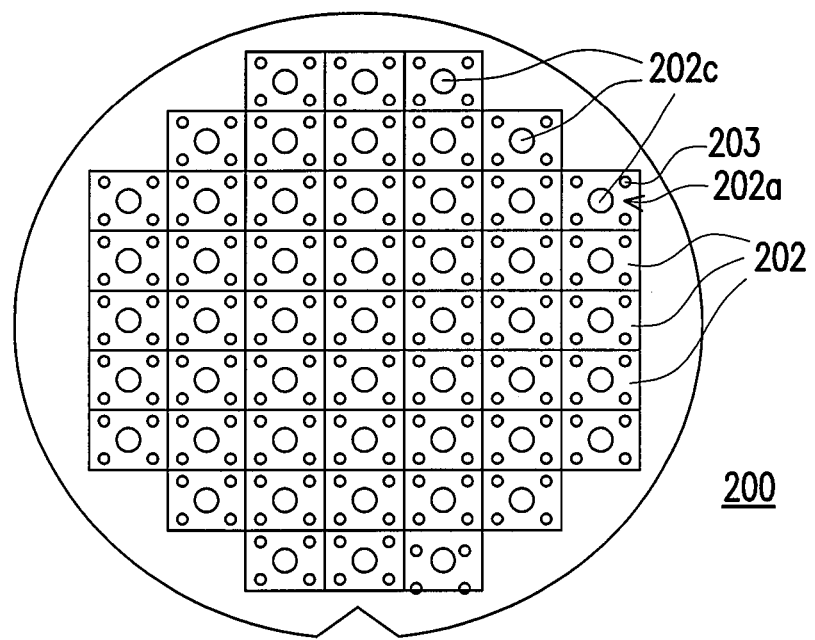
FIG. 16 is a plan view of a wafer.

Refer to both FIG. 3 and FIG. 16, wherein FIG. 16 is a plan view of a wafer, and FIG. 3 is a side cross-sectional view of the wafer in FIG. 16.

A wafer 200 is provided. A plurality of microphone chips 202 have been formed on the surface of the wafer. Each of the microphone chips 202 has a first surface 202a and an opposite second surface 202b. A plurality of electrically bonding portions 203, for example, solder pads, and an acoustic sensing portion 202c for sensing acoustic wave are disposed on the first surface 202a are disposed on the first surface 202a.

Figure 4:
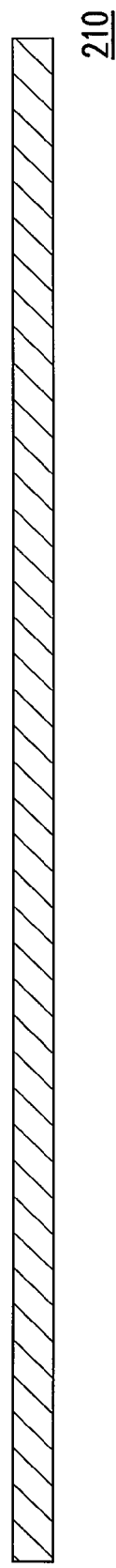
Figure 17:
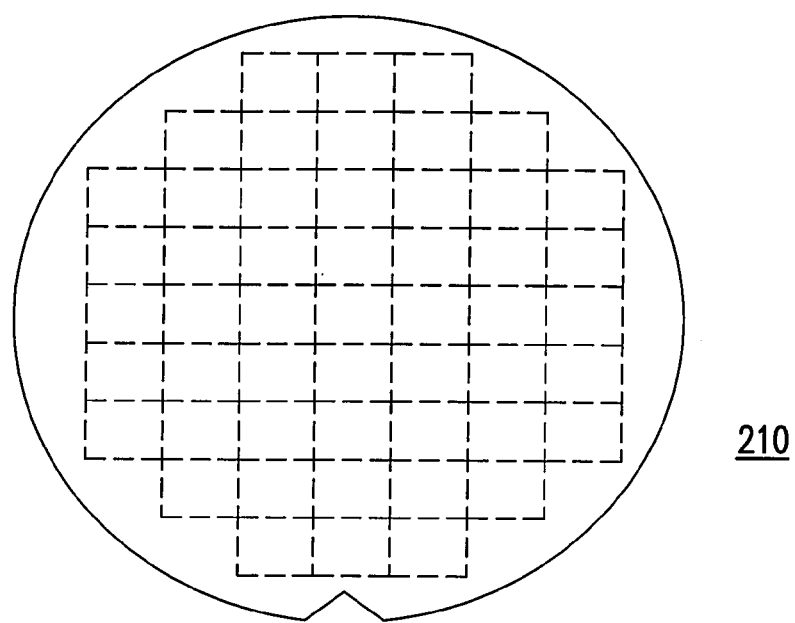
FIG. 17 is a plan view of a back acoustic plate in an inversed microphone module according to the first embodiment of the present invention.

Refer to FIG. 4 and FIG. 17, wherein FIG. 17 is a plan view of a back acoustic plate, and FIG. 4 is a side cross-sectional view of the back acoustic plate in FIG. 17.

A back acoustic plate 210 is provided. The material of the acoustic cavity cover 212 is not limited herein, which may be conductive material, general radio frequency interference proof or electromagnetic interference proof material etc. Preferably, as shown in FIG. 17, the back acoustic plate 210 has a shape corresponding to the wafer 200, and which is advantageous to subsequent process. The dotted line in FIG. 17 represents a predetermined cutting line.

Referring to FIG. 5, the back acoustic plate 210 is bonded to the wafer 200 through adhering or soldering. The back acoustic plate 210 is fixed to the back of the wafer 200 so that the back acoustic plate 210, the acoustic sensing portion 202c, and the microphone chip 202 define a back acoustic cavity Vb.

The method of bonding the back acoustic plate 210 to the wafer 200 is not limited herein; instead, according to the spirit of the present invention, any method through which the back acoustic plate 210 can be fixed to the wafer 200 is applicable here. For example, an adhesive layer (not shown) is coated or pasted to the back of wafer 200, and the wafer 200 is then heated and pressed down to the back acoustic plate 212 to bond the two.

Next, the wafer 200 and the back acoustic plate 210 are cut to separate the microphone chips 202, and meanwhile, the back acoustic plate 210 is cut into a plurality of back acoustic cavity covers 212 so as to obtain a plurality of microphone chip components 220 (referring to FIG. 6). Each of the microphone chip components 220 includes a microphone chip 202 and a back acoustic cavity cover 212.

Figure 7:
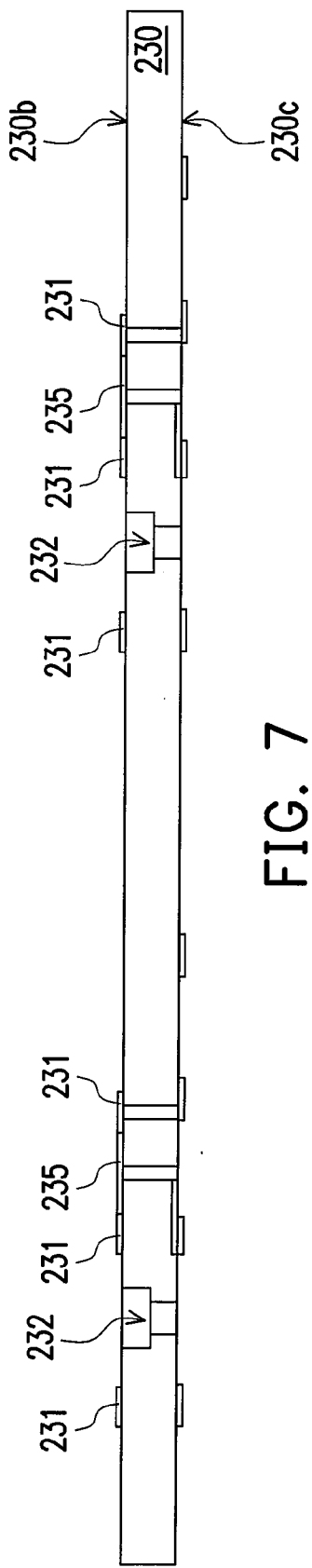
Figure 18:
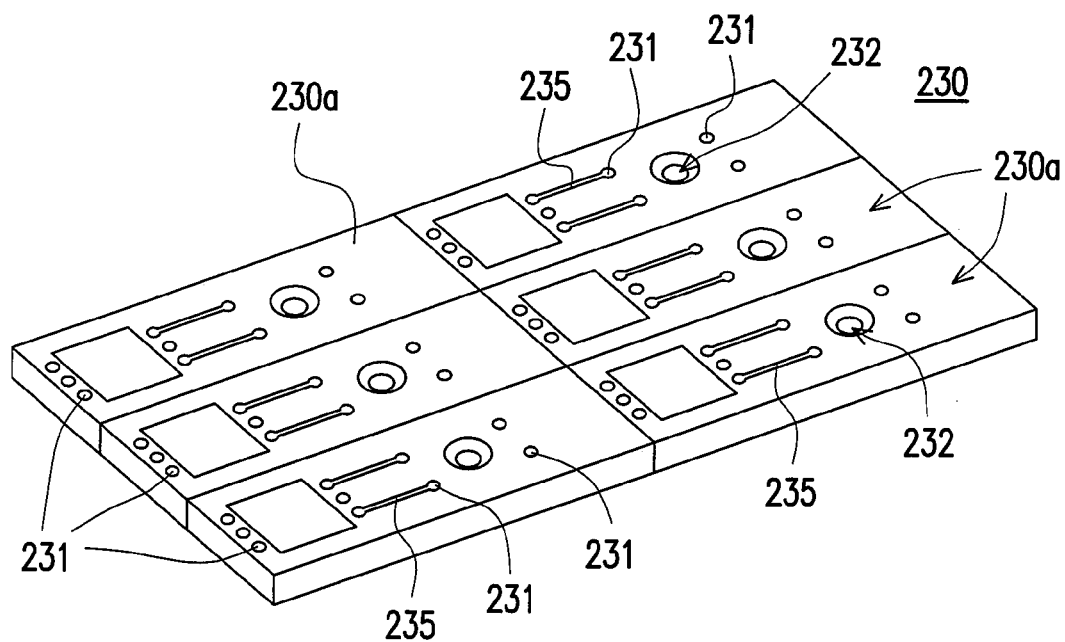
FIG. 18 is a perspective view of a substrate.

Refer to both FIG. 7 and FIG. 18, wherein FIG. 18 is a perspective view of a substrate, and FIG. 7 is a side cross-sectional view of the substrate in FIG. 18.

A substrate 230 having a top surface 230b and a bottom surface 230c is provided. The substrate 230 has a plurality of module regions 230a, and each of the module regions 230a has an acoustic hole 232 and a plurality of connection pads 231. Some of the connection pads 231 are connected to each other through traces 235. The connection pads 231 are to be electrically coupled to subsequent electronic devices. The acoustic hole 232 is a first via and the shape thereof may be a straight. Preferably, the acoustic hole 232 is a stepping via, and the opening thereof close to the microphone chip 202 is larger than the other opening.

The substrate 230 is used for carrying subsequent electronic devices and connection devices, and which may be plastic substrate, ceramic substrate, or even flexible print circuitry. In the present embodiment, the substrate 230 adopted is a PCB; however, according to the spirit of the present invention, the substrate 230 is not limited to PCB and any substrate which can carry and electrically couple electronic devices is applicable.

Figure 8:
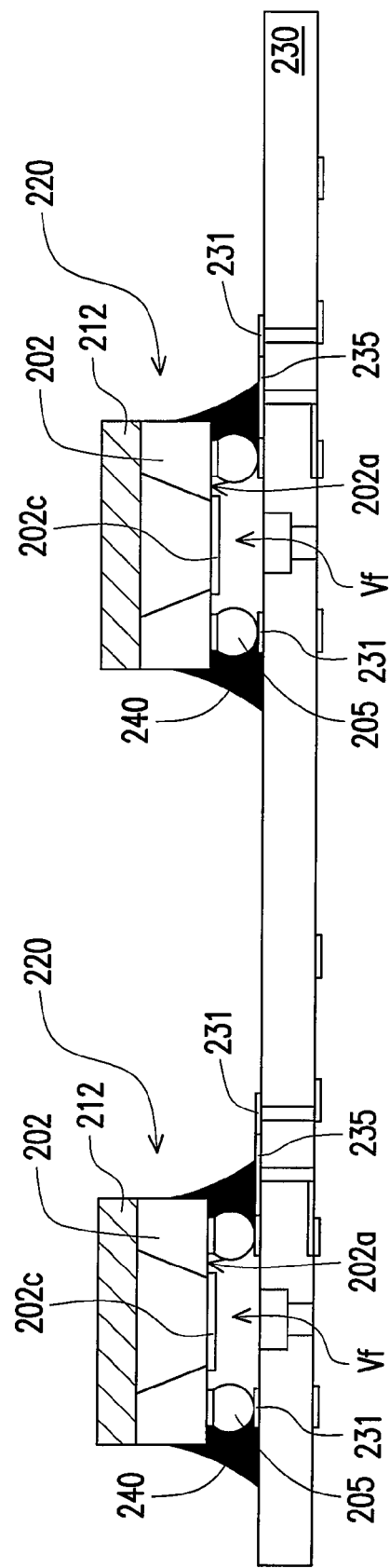

Referring to FIG. 8, the microphone chip components 220 are inversed, namely, the microphone chip 202 is electrically coupled to the connection pad 231 of the module region 230a on the substrate 230 through the electrically bonding portion 203 with the first surface 202a thereof facing down. The acoustic hole 232 of each module region 230a corresponds to the acoustic sensing portion 202c of each microphone chip 202. To be specific, the method for electrically coupling the electrically bonding portion 203 to the connection pad 231 of the substrate 230 is to form a bump or to coat solder on the electrically bonding portion 203 or the connection pad 231 and then bond the two through a reflow step. In FIG. 8, a bump 205 is formed on the electrically bonding portion 203 of the microphone chip 202 and then the two are bonded together.

Next, a sealing material 240 is used for encapsulating the microphone chip 202 and covering the substrate 230, so that the sealing material 240, the substrate 230, the acoustic sensing portion 202c, and the first surface 202a define a front acoustic cavity Vf.

Figure 9:
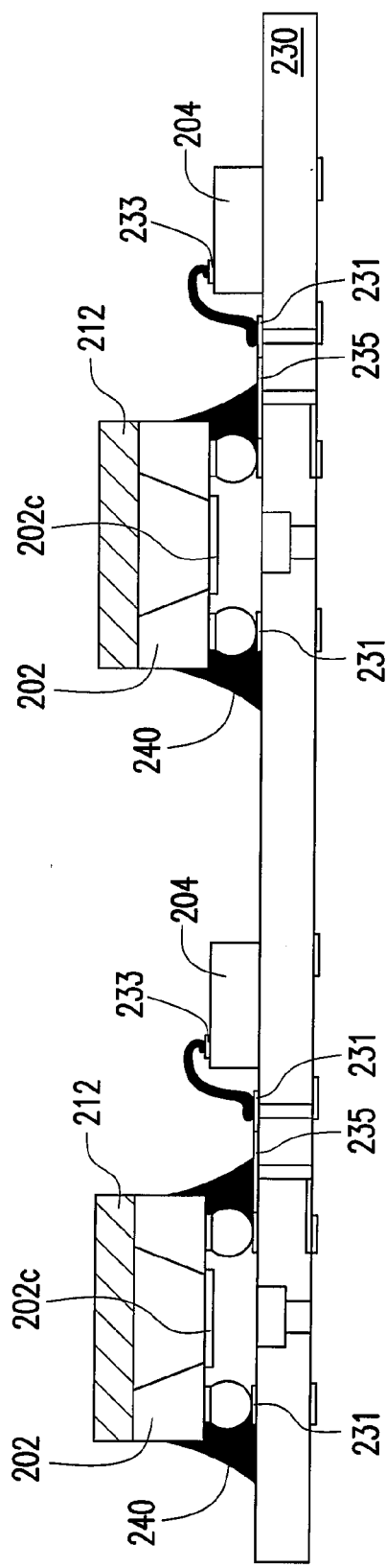

Referring to FIG. 9, logic chips 204 are provided. Each of the logic chips 204 has at least one electrically bonding portion 233, for example, a solder pad, and only one electrically bonding portion 233 is demonstratively illustrated on each logic chip 204 in FIG. 9. The logic chips 204 are electrically coupled to the connection pads 231 of the module regions 230a on the substrate 230.

To be specific, one of the electrical coupling examples is electrically coupling the electrically bonding portion 203 of the microphone chip 202 directly to the connection pad 231 of the substrate 230 and electrically coupling the electrically bonding portion 233 of the logic chip 204 directly to the connection pad 231 of the substrate 230, and then connecting the two connection pads 231 by using trace 235. Accordingly, the electrical coupling between the microphone chip 202 and the logic chip 204 can be accomplished, and the microphone chip 202 is electrical coupled to external through the logic chip 204 (not shown).

The coupling described above is only an example but not for limiting the present invention. The microphone chip 202 and the logic chip 204 may also be electrically coupled to the connection pad 231 of the substrate 230 directly and to the external through internal wiring and the I/O pad of the substrate.

Figure 10:
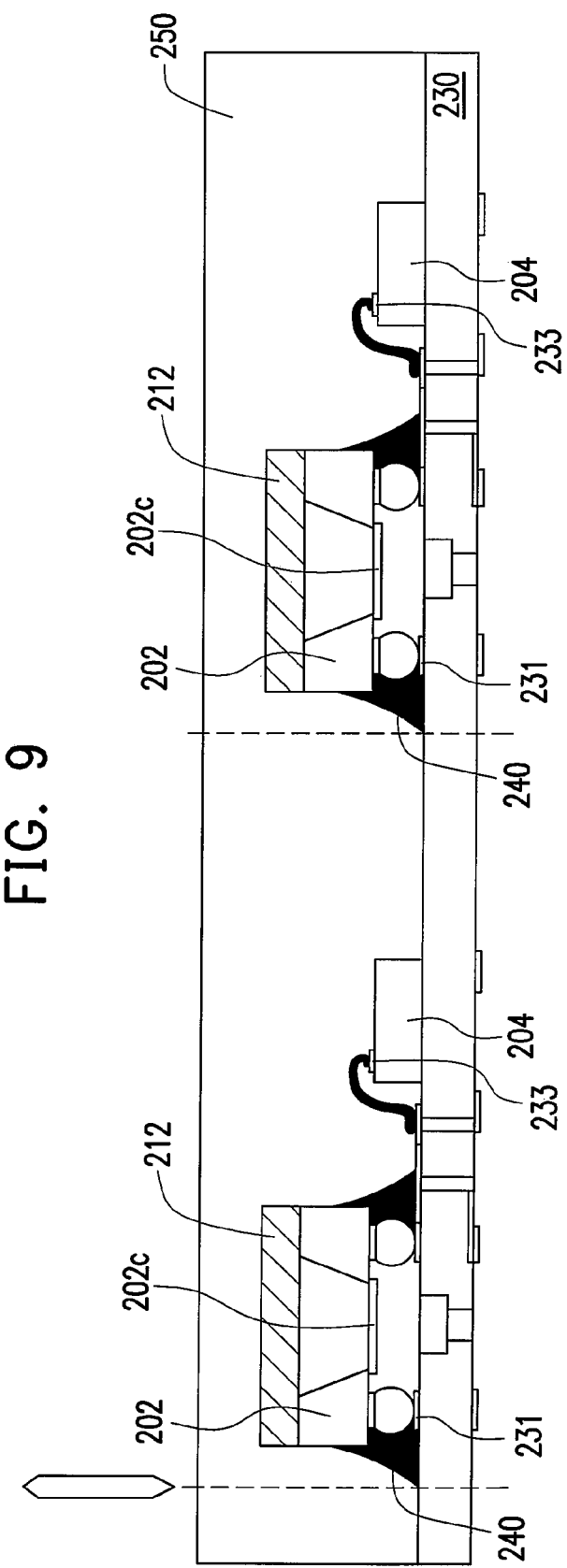

Referring to FIG. 10, a package 250 is formed with a packaging material, and the package 250 covers the substrate 230, the microphone chip components 220, and the logic chips 204. The packaging material is a material commonly used in packaging process, for example, epoxy resin.

Figure 11:
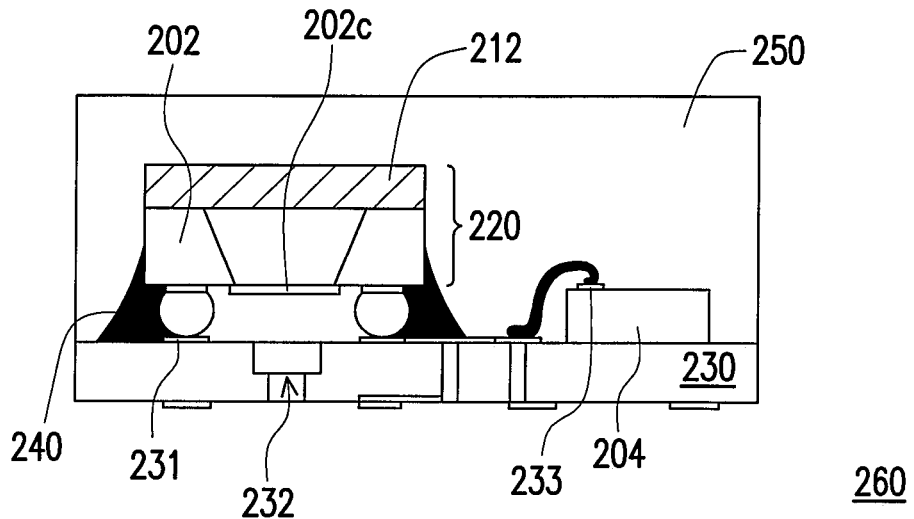

Next, a singulation step is performed, and the package 250 and the substrate 230 are cut according to the module regions 230a to obtain a plurality of microphone modules 260 (referring to FIG. 11).

Second Embodiment

Figure 12:
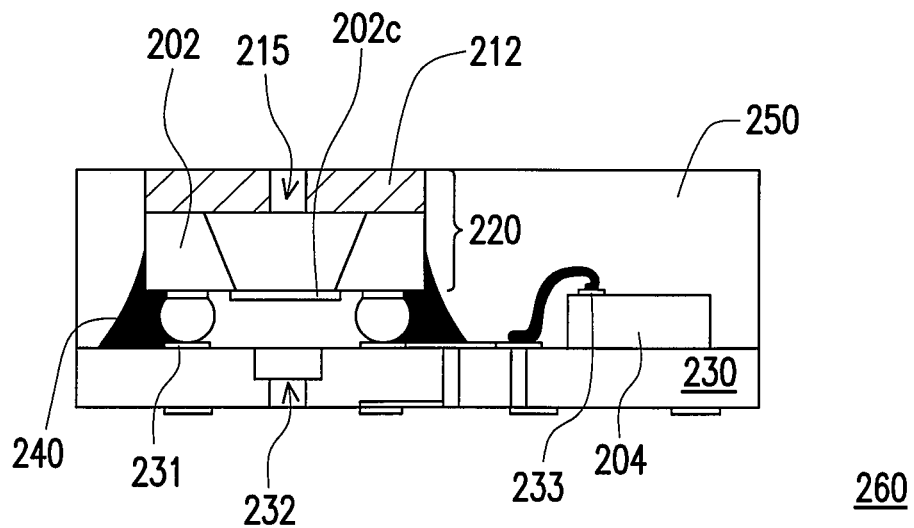
FIG. 12 illustrates an inversed microphone module according to the second embodiment of the present invention.

The difference between the second embodiment and the first embodiment is at the structures of the package 250 and the back acoustic cavity cover 212. Referring to FIG. 12, a back acoustic cavity cover 212 having a second via 215 (obtained by cutting the back acoustic plate having a via) is adopted and a predetermined mold shape is used to make the package 250 expose the surface and the second via 215 of the back acoustic cavity cover 212 and to make the surface of the package 250 to be level to the exposed surface of the back acoustic cavity cover 212.

The number of the second vias 215 is not limited herein, which may be one or more. The second vias 215 may be arranged as an array, radial, irregular, etc.

Accordingly, the volume of the microphone module can be further reduced and the acoustic sensing ability of the microphone module can be further improved.

Third Embodiment

Figure 19:
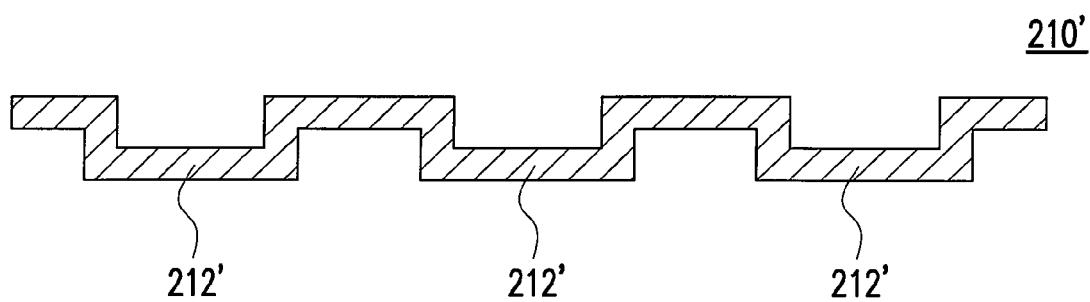
FIG. 19 is a diagram of a back acoustic plate in an inversed microphone module according to the third embodiment of the present invention.
Figure 20:
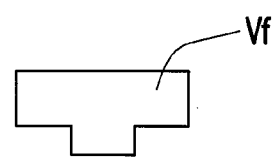
FIG. 20 illustrates the volume of a front acoustic cavity in an inversed microphone module according to an embodiment of the present invention.

In the first embodiment, a flat plate is adopted as an example of the back acoustic plate 210. However, to further enlarge the volume of the back acoustic cavity, the back acoustic plate can be made to have a predetermined roughness, such as the back acoustic plate 210' in FIG. 19, and a plurality of protruding back acoustic cavity covers 212' (referring to FIG. 13) can be obtained by cutting the back acoustic plate 210'.

Figure 13:
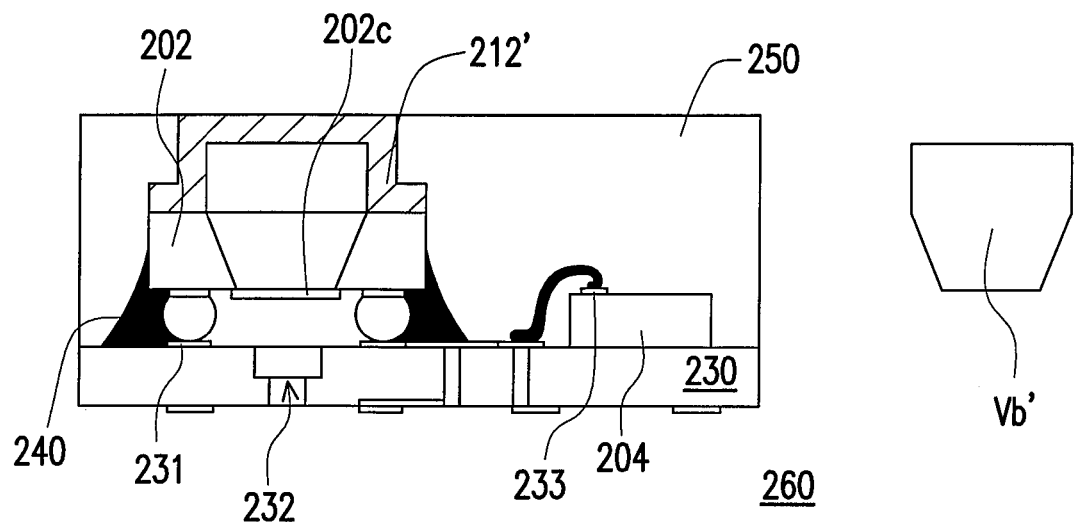
FIG. 13 illustrates the structure of an inversed microphone module and the volume of a back acoustic cavity defined by the inversed microphone module according to the third embodiment of the present invention.

Referring to FIG. 13, the back acoustic plate 210 in the first embodiment is replaced by the back acoustic plate 210', the package exposes the surface of the back acoustic cavity cover 212' and the surface of the package 250 is level to the exposed surface of the back acoustic cavity cover 212'. The volume of the back acoustic cavity becomes Vb' which is obviously larger than the volume V2 of the conventional back acoustic cavity (referring to FIG. 2).

A back acoustic cavity cover having a via may also be adopted as in the second embodiment, and the via is exposed (not shown).

In the first to third embodiments described above, even though the microphone chip and the logic chi pare covered in the package together, the logic chip may also be disposed outside of the package according to the spirit of the present invention.

Variation

Figure 14:
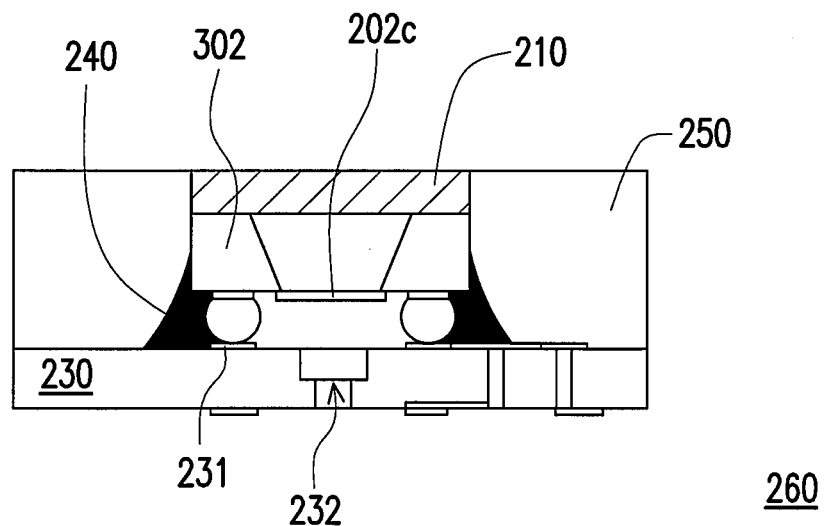
FIGS. 14 and 15 illustrate the structure of a variation of an inversed microphone module according to an embodiment of the present invention.
Figure 15:
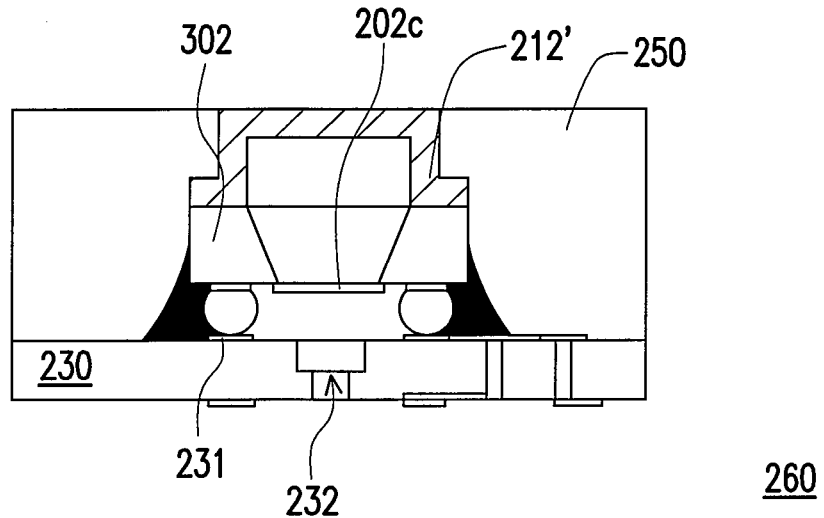

To make the structure more compact, the microphone chip and the logic chip can be integrated into a system chip 302 to replace the original microphone chip 202 and logic chip 204, so that the more compact structure in FIG. 14 and FIG. 15 is obtained.

The back acoustic cavity cover having a via in the second embodiment may also be adopted in the varied example (not shown).

According to the embodiments of the present invention, the present invention has at least following advantages:

From the point of acoustics, the restraining frequency $f_e$ can be expressed with following expression according to Helmholtz theorem:

$$f_e = \frac{c}{2\pi} \sqrt{\frac{S}{Vl_e}} \qquad \text{(expression 1)}$$

In expression 1, V represents the volume of the front acoustic cavity. The smaller the volume of the front acoustic cavity is, the higher the restraining frequency $f_e$ is.

Figure 1:
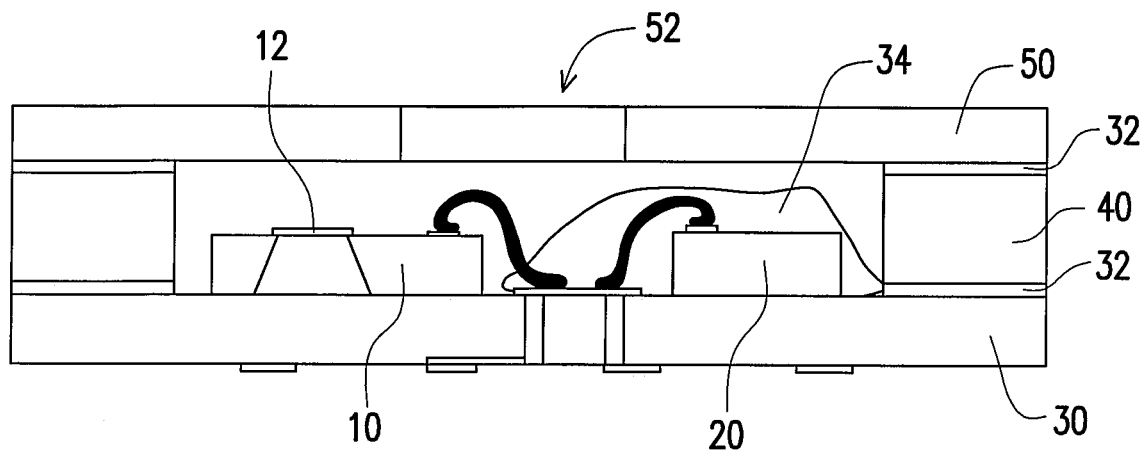
FIG. 1 is a cross-sectional view of a conventional Knowles microphone module.
Figure 2:
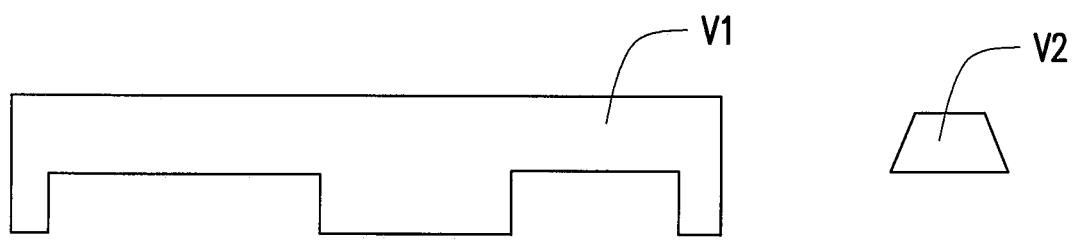
FIG. 2 illustrates a front acoustic cavity and a back acoustic cavity of the microphone module in FIG. 1.

According to the present invention, the substrate has an acoustic hole, and the microphone chip is electrically coupled to the connection pad of the substrate in inversed manner, and the sealing material, substrate, acoustic sensing portion, the first surface of the microphone chip define a front acoustic cavity, so that the front acoustic cavity defined is smaller than that in a conventional microphone module (the volume of the conventional front acoustic cavity is V1 in FIG. 2, the volume of the front acoustic cavity in the present invention is Vf, and obviously Vf is smaller than V1), accordingly the restraining frequency $f_e$ can be increased and the acoustic sensing range can be widened.

According to the present invention, the package covers the substrate and the microphone chip, so that the microphone chip and the connection joints thereof can be well protected, accordingly the affection of external vibration and humidity can be reduced.

According to the present invention, a package is used to replace the conventional top plate and supporting ring, so that the relative process for coating inter-layer conductive compound can be skipped, and the thickness and volume of the module be greatly reduced. According to the specifications of existing well-know products, the thickness of a existing Knowles microphone module is about 1.65 mm, the bottom surface area thereof is about 6.2×3.8 mm, however, the thickness of a package structure in an embodiment of the present invention may be as small as 1.3 mm, and the area of the electrically bonding portion may be about 4.8×2.7 mm. The volume of a microphone module in an embodiment of the present invention may be reduced to 48% of the volume of a conventional microphone module.

According to the present invention, a wafer having a plurality of microphone chips is bonded to a corresponding back acoustic plate, and after that, the wafer and the back acoustic plate are cut, so that various components can be processed together. Namely, according to the present invention, the back acoustic plate and the wafer can be bonded in the same process before they are cut, so that the production throughput can be greatly increased.

According to the present invention, a package is formed with packaging material for covering the substrate and the microphone chip components, so that a batch of microphone chips and the connection joints thereof can be packed and protected all together by performing one mature molding process, such as resin transform molding to reduce the time consumed. Moreover, the molding process is mature and has high qualified rate, thus, the production throughput can be increased and the manufacturing cost can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inversed microphone module, comprising:
   a substrate, having a plurality of connection pads and an acoustic hole;
   a microphone chip, having a first surface and a second surface opposite to the first surface, a plurality of electrically bonding portions and an acoustic sensing portion being disposed on the first surface, the microphone chip being electrically coupled to the connection pads of the substrate through the electrically bonding portions, the acoustic hole corresponding to the acoustic sensing portion;
   a back acoustic cavity cover, fixed to the second surface, the back acoustic cavity cover defining a back acoustic cavity with the acoustic sensing portion and the microphone chip; and
   a sealing material, encapsulating a peripheral of the microphone chip and covering the substrate, and the sealing material defining a front acoustic cavity with the substrate, the acoustic sensing portion, and the first surface such that the sealing material directly embraces the microphone chip and the connection pads of the substrate.

2. The inversed microphone module as claimed in claim 1, wherein the shape of the back acoustic cavity cover comprises protruding shape.

3. The inversed microphone module as claimed in claim 1, wherein the acoustic hole is a first via.

4. The inversed microphone module as claimed in claim 1, wherein the shape of the acoustic hole comprises stepping shape, and an opening of the acoustic hole at a side close to the microphone chip is larger than an opening of the acoustic hole at a side away from the microphone chip.

5. The inversed microphone module as claimed in claim 1, wherein the back acoustic cavity cover has at least one second via.

6. The inversed microphone module as claimed in claim 1 further comprising an encapsulant encapsulating the substrate, the sealing material, the microphone chip, and the back acoustic cavity cover.

7. The inversed microphone module as claimed in claim 1 further comprising anencapsulant encapsulating the substrate, the sealing material, the microphone chip, and the back acoustic cavity cover and exposing a surface of the back acoustic cavity cover so that a surface of the encapsulant being level to the exposed surface of the back acoustic cavity cover.

8. The inversed microphone module as claimed in claim 6 further comprising a logic chip electrically coupled to the connection pads of the substrate, and the encapsulant encapsulating the logic chip.

9. The inversed microphone module as claimed in claim 7 further comprising a logic chip electrically coupled to the connection pads of the substrate, and the encapsulant encapsulating the logic chip.

10. The inversed microphone module as claimed in claim 1, wherein the microphone chip is a system chip integrated with a function of a microphone chip and a function of a logic chip.

11. The inversed microphone module as claimed in claim 1, wherein a size of the back acoustic cavity cover is not larger than a size of the microphone chip.

12. A microphone chip component, comprising:
    a microphone chip, having a first surface and a second surface opposite to the first surface, a plurality of electrically bonding portions and an acoustic sensing portion being disposed on the first surface; and
    a back acoustic cavity cover, fixed to the second surface of the microphone chip, defining a back acoustic cavity with the acoustic sensing portion and the microphone chip, wherein the back acoustic cavity cover has at least one second via, and a size of the back acoustic cavity cover is not larger than a size of the microphone chip.

* * * * *